United States Patent
Schulze et al.

(10) Patent No.: US 8,889,531 B2
(45) Date of Patent: Nov. 18, 2014

(54) SEMICONDUCTOR DEVICE HAVING TWO MONOCRYSTALLINE SEMICONDUCTOR REGIONS WITH A DIFFERENT LATTICE CONSTANT AND A STRAINED SEMICONDUCTOR REGION BETWEEN

(75) Inventors: Hans-Joachim Schulze, Taufkirchen (DE); Franz-Josef Niedernostheide, Muenster (DE); Reinhart Job, Horstmar (DE)

(73) Assignee: Infineon Technologies Austria AG, Villach (AT)

( * ) Notice: Subject to any disclaimer, the term of this patent is extended or adjusted under 35 U.S.C. 154(b) by 279 days.

(21) Appl. No.: 13/237,097

(22) Filed: Sep. 20, 2011

(65) Prior Publication Data

US 2012/0112242 A1    May 10, 2012

(30) Foreign Application Priority Data

Sep. 21, 2010   (DE) .......................... 10 2010 046 215

(51) Int. Cl.
| | |
|---|---|
| H01L 21/20 | (2006.01) |
| H01L 21/02 | (2006.01) |
| H01L 29/04 | (2006.01) |
| H01L 21/30 | (2006.01) |
| H01L 29/78 | (2006.01) |

(52) U.S. Cl.
CPC .... *H01L 21/02532* (2013.01); *H01L 21/02381* (2013.01); *H01L 29/045* (2013.01); *H01L 21/3003* (2013.01); *H01L 21/0243* (2013.01); *H01L 29/7842* (2013.01); *H01L 21/02667* (2013.01); *H01L 21/0245* (2013.01); *H01L 21/02658* (2013.01)
USPC ........... 438/486; 438/488; 438/457; 257/190; 257/E21.09; 257/E29.004

(58) Field of Classification Search
USPC .................... 438/486, 488; 257/190, E21.09, 257/E29.004
See application file for complete search history.

(56) References Cited

U.S. PATENT DOCUMENTS

| | | | |
|---|---|---|---|
| 5,534,713 A * | 7/1996 | Ismail et al. ................... 257/24 |
| 6,059,895 A * | 5/2000 | Chu et al. ..................... 148/33.1 |
| 6,927,414 B2 | 8/2005 | Ouyang et al. |
| 7,084,046 B2 * | 8/2006 | Mitani et al. .................. 438/459 |
| 7,491,612 B2 * | 2/2009 | Schruefer ...................... 438/285 |
| 7,531,392 B2 | 5/2009 | Ellis-Monaghan et al. |
| 7,569,442 B2 | 8/2009 | Ouyang et al. |
| 7,598,153 B2 * | 10/2009 | Henley et al. ................. 438/455 |
| 7,804,110 B2 * | 9/2010 | Schruefer ...................... 257/192 |
| 7,879,699 B2 * | 2/2011 | Schulze et al. ................ 438/480 |
| 7,902,008 B2 | 3/2011 | Peidous et al. |
| 7,902,012 B2 | 3/2011 | Ouyang et al. |

(Continued)

FOREIGN PATENT DOCUMENTS

| | | |
|---|---|---|
| CN | 1574252 A | 2/2005 |
| CN | 2720640 Y | 8/2005 |
| DE | 11 2006 002 055 B4 | 7/2008 |
| WO | 2005064686 A1 | 7/2005 |

*Primary Examiner* — Caleb Henry
(74) *Attorney, Agent, or Firm* — Murphy, Bilak & Homiller, PLLC

(57) ABSTRACT

A semiconductor body comprised of a semiconductor material includes a first monocrystalline region of the semiconductor material having a first lattice constant along a reference direction, a second monocrystalline region of the semiconductor material having a second lattice constant, which is different than the first, along the reference direction, and a third, strained monocrystalline region between the first region and the second region.

10 Claims, 3 Drawing Sheets

(56) References Cited

U.S. PATENT DOCUMENTS

| | | | |
|---|---|---|---|
| 7,981,768 B2* | 7/2011 | Le Vaillant | 438/459 |
| 7,982,289 B2* | 7/2011 | Schulze et al. | 257/607 |
| 8,263,483 B2* | 9/2012 | Hirler et al. | 438/499 |
| 2002/0179946 A1* | 12/2002 | Hara et al. | 257/288 |
| 2003/0017626 A1* | 1/2003 | Hilt et al. | 438/3 |
| 2003/0154912 A1* | 8/2003 | Kartal et al. | 117/92 |
| 2003/0162335 A1* | 8/2003 | Yuki et al. | 438/151 |
| 2003/0201497 A1* | 10/2003 | Inoue et al. | 257/351 |
| 2003/0203547 A1* | 10/2003 | Sakaguchi et al. | 438/151 |
| 2004/0000268 A1* | 1/2004 | Wu et al. | 117/94 |
| 2004/0126958 A1 | 7/2004 | Usuda et al. | |
| 2004/0137663 A1* | 7/2004 | Amer et al. | 438/118 |
| 2004/0142541 A1* | 7/2004 | Cohen et al. | 438/479 |
| 2004/0217352 A1* | 11/2004 | Forbes | 257/65 |
| 2004/0224480 A1* | 11/2004 | Forbes | 438/455 |
| 2004/0256614 A1 | 12/2004 | Ouyang et al. | |
| 2005/0009288 A1* | 1/2005 | Cheng et al. | 438/407 |
| 2005/0023646 A1* | 2/2005 | Lee et al. | 257/616 |
| 2005/0136624 A1* | 6/2005 | Cheng et al. | 438/478 |
| 2005/0239241 A1 | 10/2005 | Ouyang et al. | |
| 2006/0024917 A1* | 2/2006 | Henley et al. | 438/455 |
| 2006/0035436 A1* | 2/2006 | Schulze | 438/345 |
| 2006/0141742 A1* | 6/2006 | Fournel et al. | 438/455 |
| 2006/0160329 A1* | 7/2006 | Henley et al. | 438/457 |
| 2006/0211221 A1* | 9/2006 | Mantl et al. | 438/475 |
| 2006/0240644 A1* | 10/2006 | Le Vaillant | 438/455 |
| 2007/0013002 A1* | 1/2007 | Schruefer | 257/347 |
| 2007/0090487 A1* | 4/2007 | Babich et al. | 257/592 |
| 2007/0099399 A1* | 5/2007 | Daval et al. | 438/478 |
| 2007/0105256 A1* | 5/2007 | Fitzgerald | 438/34 |
| 2007/0105274 A1* | 5/2007 | Fitzgerald | 438/107 |
| 2007/0105335 A1* | 5/2007 | Fitzgerald | 438/405 |
| 2007/0176210 A1* | 8/2007 | Murphy et al. | 257/211 |
| 2007/0287269 A1* | 12/2007 | Yokokawa et al. | 438/478 |
| 2008/0020551 A1* | 1/2008 | Currie et al. | 438/478 |
| 2008/0169508 A1* | 7/2008 | Chidambarrao et al. | 257/351 |
| 2008/0217690 A1* | 9/2008 | Mandelman et al. | 257/351 |
| 2009/0121289 A1* | 5/2009 | Schruefer | 257/347 |
| 2009/0226680 A1* | 9/2009 | Marty et al. | 428/195.1 |
| 2009/0242935 A1* | 10/2009 | Fitzgerald | 257/187 |
| 2009/0283866 A1* | 11/2009 | Schulze et al. | 257/607 |
| 2009/0298270 A1* | 12/2009 | Mauder et al. | 438/530 |
| 2009/0305486 A1* | 12/2009 | Schulze et al. | 438/478 |
| 2010/0009525 A1* | 1/2010 | Hirler et al. | 438/499 |
| 2010/0015818 A1* | 1/2010 | Barthelmess et al. | 438/798 |
| 2010/0133658 A1* | 6/2010 | Dadgar et al. | 257/615 |
| 2010/0147383 A1* | 6/2010 | Carey et al. | 136/261 |
| 2010/0159658 A1 | 6/2010 | Ouyang et al. | |
| 2010/0210090 A1* | 8/2010 | Ghyselen et al. | 438/458 |
| 2010/0210091 A1* | 8/2010 | Mauder et al. | 438/459 |
| 2011/0031530 A1* | 2/2011 | Schruefer | 257/192 |

\* cited by examiner

SEMICONDUCTOR DEVICE HAVING TWO MONOCRYSTALLINE SEMICONDUCTOR REGIONS WITH A DIFFERENT LATTICE CONSTANT AND A STRAINED SEMICONDUCTOR REGION BETWEEN

PRIORITY CLAIM

This application claims priority to German Patent Application No. 10 2010 046 215.2 filed on 21 Sep. 2010, the content of said application incorporated herein by reference in its entirety.

TECHNICAL FIELD

The instant application relates to a semiconductor body and an electronic component including a semiconductor body having a strained region, and to a method for producing such a semiconductor body.

BACKGROUND

Semiconductor bodies having strained regions are used in MOS transistors, inter alia. FIG. 1a shows, by way of example, a PMOS transistor including a drain region 1, a source region 2 and a channel region 3 in a semiconductor body 4. A gate electrode 5 is arranged above the channel region 3, the gate electrode 5 being separated from the channel region 3 by a gate oxide 6. Both the drain region 1 and the source region 2 are provided with a contact 7 and 8, respectively.

In the example shown the drain region 1 and the source region 2 consist of silicon-germanium, while the channel region 3 is produced from silicon. As a result of the higher lattice constant of silicon-germanium compared with silicon, a compressive strain is produced in the silicon in the plane parallel to the surface in the channel region 3. The arrows symbolize the compressive stress produced. This compressive stress leads to a reduction of the effective mass of the free holes and thus to an increase in the hole mobility.

Another example, illustrated in FIG. 1b, shows the inducing of a tensile stress (represented as arrows) in the channel region 3 by using a suitable covering material 9 above the gate. This induced tensile stress leads to a reduction of the effective mass of the free electrons and thus to an increase in the electron mobility, such that an NMOS-transistor having a lower channel resistance can be produced in this way.

However, the use of different materials for producing the strains has a number of disadvantages. Firstly, it makes the production process more expensive. Furthermore, the use of different materials often also requires an additional material-specific adhesion layer, metallization and passivation materials, such that the production process is more complex and thus made more expensive.

SUMMARY

Embodiments described herein provide a less expensive and simpler semiconductor body that can be produced with a strained layer. The embodiments relate generally to a semiconductor body composed of a semiconductor material, comprising a first monocrystalline region of the semiconductor material having a first lattice constant along a reference direction, a second monocrystalline region of the semiconductor material having a second lattice constant, which is different than the first, along the reference direction, and a third, strained monocrystalline region between the first region and the second region.

Here and hereinafter, "strained" means that the lattice constant of the first region is continued further in the second region, although the lattice constant of the second region is greater or less than that of the first region. Mechanical stresses thus arise in the crystal, which occur in a strained region between the first region and the second region. In the case of an unstrained semiconductor body, the differences between the lattice constants are compensated for by defects in the lattice structure.

Through the use of one and the same semiconductor material, such as e.g. silicon, for the first region and the second region, but with different lattice constants of the two regions, it is possible to provide a semiconductor body having a strained region which can be produced in a less expensive and more simple manner because it is not necessary to use different materials.

One possibility for straining the lattice structure between two regions of the same semiconductor material is if a first monocrystalline region of the semiconductor material has a first crystal orientation and the second monocrystalline region has a second crystal orientation which is different than the first crystal orientation.

In one embodiment the first crystal orientation is (100) and the second crystal orientation is (111) or (311). In this case, the numerical indications between the parentheses represent the Miller indices of a cubic crystal lattice. A (111) or (311) orientation of the second region on a (100) orientation of the first region can be realized in a particularly advantageous manner.

One specific embodiment relates to an electronic component comprising a semiconductor body as described above, wherein the semiconductor body contains at least two dopant regions, which form at least one pn junction.

In particular, the electronic component can comprise a semiconductor body, in which a first dopant region of a first conduction type, a second dopant region of a first conduction type and a third dopant region of a second conduction type, inverse with respect to the first conduction type, the third dopant region being situated between the first and second dopant regions, are formed, and wherein at least the third dopant region at least partly comprises the strained region of the semiconductor body. By way of example, in the case of a MOSFET configured in this way, by means of the strained region, it is possible to increase the charge carrier mobility in the third dopant region (channel region) or to reduce the channel resistance.

The third, strained monocrystalline region can therefore be provided very generally only in the component regions in which an increase in the charge carrier mobility is advantageous, as is the case e.g. in the region of an inversion channel below a MOSFET control electrode. In the region of an edge termination of the pn junction, that is to say outside the active region of an electronic power semiconductor component, it can be advantageous if the mobility of the charge carriers is not increased, since this can lead to a reduction of the breakdown voltage on account of an avalanche breakdown commencing at lower voltages.

Furthermore, embodiments described herein relate to a method for producing a semiconductor body having a strained region. The method includes the following features: providing a first monocrystalline semiconductor region composed of a semiconductor material, e.g. silicon, having a first lattice constant along a reference direction; producing a second monocrystalline semiconductor region composed of the same semiconductor material adjoining the first semiconductor region and having a second lattice constant, which is different than the first lattice constant, along the reference direction, wherein a third, strained semiconductor region arises between the first and second semiconductor regions. As a result, a semiconductor body having a strained region can be produced from the same semiconductor material. The third, strained semiconductor region can extend, in the case of a semiconductor wafer, for example, over the entire semiconductor wafer area. However, it can also be delimited only to specific partial regions of the semiconductor body in which the positive properties of the third, strained semiconductor region, such as e.g. the increased charge carrier mobility, become apparent in a positive manner for the use of the semiconductor body in e.g. electrical semiconductor components.

It can be particularly suitable for the method if producing the second semiconductor region includes the following features: producing a µ-crystalline or amorphous or a partly µ-crystalline and partly amorphous layer at a surface of the first semiconductor region, and thermal treatment of the µ-crystalline and/or amorphous layer with a temperature above 800° Celsius, for example in a temperature range of between 800° Celsius and 1250° Celsius, and in particular between 1100° Celsius and 1200° Celsius, wherein the layer re-crystallizes. As a result, it is possible to produce a second semiconductor region having a different lattice constant than the first semiconductor region, which then leads to the desired strained region.

In this case, the term µ-crystalline designates a layer typically having crystal grains with an average size of the order of magnitude of from approximately 10 nm to approximately 100 µm, in particular of the order of magnitude of 100 nm to 30 µm.

One advantageous way of producing the µ-crystalline and/or amorphous layer is if the producing is effected by means of a layer deposition method on the surface of the first semiconductor region. In particular, a deposition method having the following features is suitable for this purpose: irradiating or treating the surface of the first semiconductor region with low-energy particles, e.g. by means of a hydrogen plasma treatment, wherein the low-energy particles dislodge atoms of the semiconductor material from the monocrystalline first semiconductor region and these dislodged atoms are deposited on the remaining surface of the first semiconductor region. By way of example, hydrogen ions can be used as low-energy particles. In this case, the deposited semiconductor material can also be doped with hydrogen.

An alternative method for depositing the µ-crystalline and/or amorphous layer is if this deposition is effected by means of sputtering and/or vapor deposition.

The µ-crystalline and/or amorphous layer can be produced, for example, with a layer thickness of 0.5 µm to 5 µm.

A further variant for producing the second monocrystalline semiconductor region is if the second semiconductor region is applied on the first monocrystalline semiconductor region by means of wafer bonding, wherein two wafers or slices, one of which is the first semiconductor region and the other the second semiconductor region, are bonded to one another. This method variant is particularly suitable if both monocrystalline semiconductor regions consist of silicon.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Exemplary embodiments of the invention are explained in greater detail below, with reference to the accompanying figures. However, the invention is not restricted to the embodiments as specifically described, but rather can be modified and altered in a suitable manner. It lies within the scope of the invention to suitably combine individual features and feature combinations of one embodiment with features and feature combinations of another embodiment in order to arrive at further embodiments according to the invention.

Figure 1A:
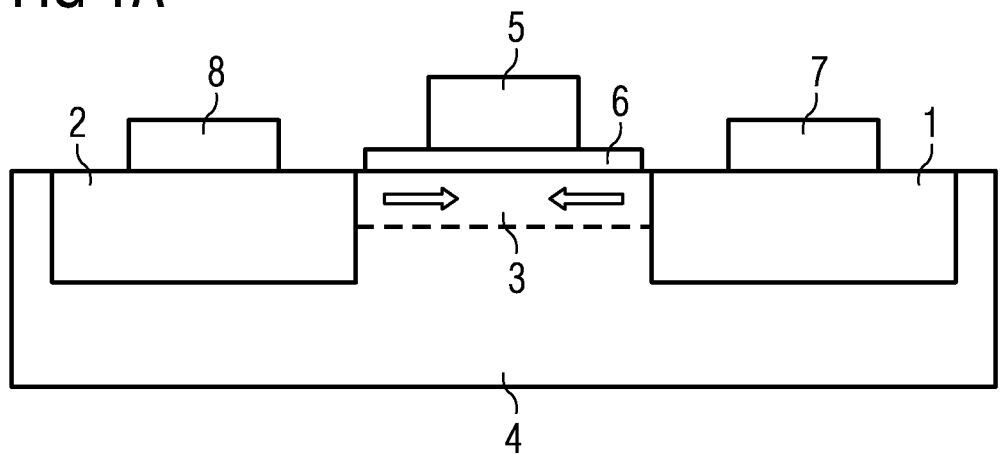
FIG. 1a shows, in a schematic cross-sectional view, a MOS-transistor having a compressively strained channel region.
Figure 1B:
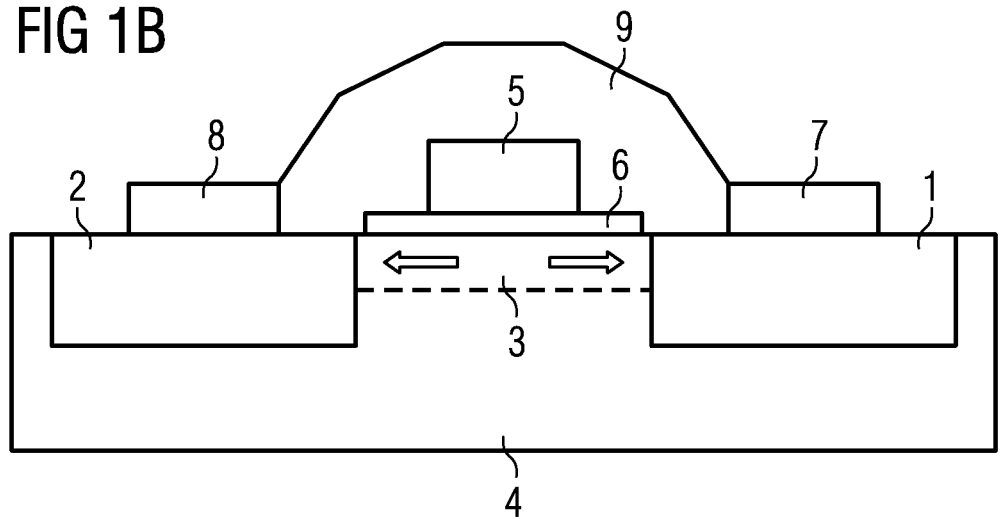
FIG. 1b shows, in a schematic cross-sectional view, a MOS-transistor having a tensile-strained channel region.
Figure 2:
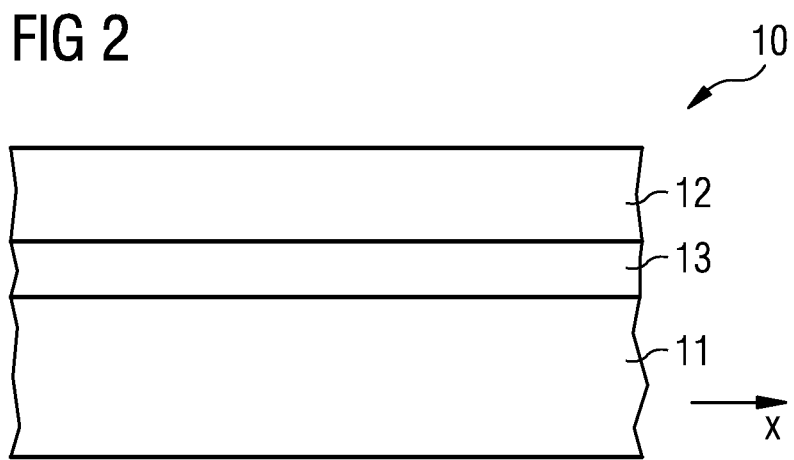
FIG. 2 shows, in a schematic cross-sectional view, a semiconductor body composed of a uniform semiconductor material having a strained monocrystalline region between a first region and a second region.

FIG. 2 schematically illustrates a cross section through a semiconductor body 10. The semiconductor body 10 is composed of a uniform semiconductor material such as silicon, for example. In this case, the semiconductor body 10 has a first monocrystalline region 11 of the semiconductor material having a first lattice constant along a reference direction X. The first monocrystalline region 11 comprises, for example, of a (100) oriented silicon single crystal and can be, for example, a commercially available silicon substrate wafer that is usually produced with a (100) crystal orientation.

Furthermore, the semiconductor body 10 also has a second monocrystalline region 12 composed of the same semiconductor material, the second region 12 having a second lattice constant, which is different than the first, along the reference direction X. A third, strained monocrystalline region 13 arises between the first region 11 and the second region 12. The strained third region 13 generally has the same crystal orientation as the first region 11 and is strained by the second region 12. The entire semiconductor body 10, comprising the first region 11, the second region 12 and the strained third region 13, thus comprises the same semiconductor material but with different lattice constants and strains. In particular, this holds true for a semiconductor body 10 composed of silicon having a first region 11, which has a first crystal orientation (for example (100)), and a second region 12, which has a second crystal orientation, for example (111) or (311), which is different than the first crystal orientation.

Depending on whether the second region 12 has, relative to the first region 11, a higher lattice constant or a lower lattice constant along the reference direction X, tensile stresses or compressive stresses occur in the third, strained region 13 along the reference direction X. Thus, by way of example, the third region 13 is tensile-strained in the case of a (311) crystal orientation of the second region 12 relative to a (100) crystal orientation of the first region 11 in a silicon semiconductor body 10.

A semiconductor body having a strained layer as described above can be used in an electronic component having at least two dopant regions in the semiconductor body, which form at least one pn junction. By way of example, the electronic component can have in the semiconductor body a first dopant region of a first conduction type, a second dopant region of a first conduction type and a third dopant region of a second conduction type, inverse with respect to the first conduction type, the third dopant region being situated between the first and second dopant regions. In particular, such a structure in a MOSFET is realized as a drain region, source region and a channel region interposed between the drain and source regions. In this case, at least the third dopant region (channel region in the MOSFET example) should at least partly comprise the strained third region of the semiconductor body.

Figure 3A:
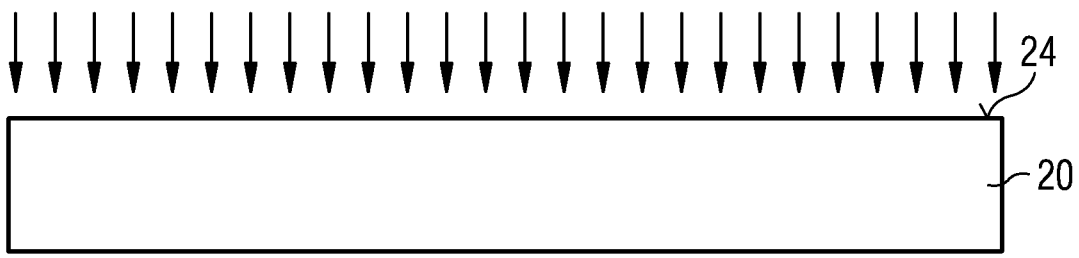
FIG. 3 shows an exemplary method sequence for producing a semiconductor body having a strained layer.
Figure 3A:
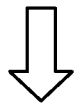

FIG. 3a illustrates a first method stage of an exemplary embodiment for producing a semiconductor body having a strained region. This involves providing a first monocrystalline semiconductor region 20 composed of a semiconductor material, for example silicon, having a first lattice constant along the reference direction X. This first, monocrystalline region 20, which can be, for example, a semiconductor wafer or alternatively only part of a semiconductor wafer, such as, for example, an epitaxial layer, is treated with low-energy particles at a first surface 24 in a vacuum, e.g. by means of a hydrogen plasma treatment. In this case, the low-energy particles typically have energies in the range of 10 eV to 100 eV and are accelerated hydrogen ions, for example. In this case, the first monocrystalline semiconductor region 20 can be used as an electrode. This irradiation or treatment knocks atoms out of the first surface 24 of the monocrystalline semiconductor region 20.

Figure 3B:
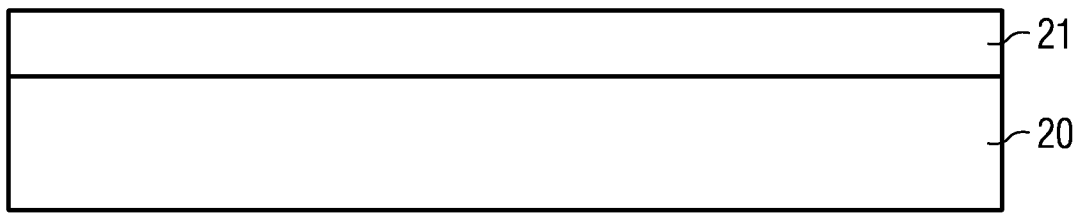
Figure 3B:
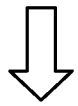

These atoms released from the assemblage of the first monocrystalline semiconductor region 20 then form, in the exemplary case of a silicon semiconductor material, silane molecules or similar compounds in the gas phase, which then deposit again in the form of µ-crystalline silicon, that is to say silicon crystals having average crystal diameters of from 10 nm to 100 µm, or in the form of amorphous silicon, on the first monocrystalline semiconductor region 20. In the exemplary embodiment with a silicon semiconductor material, therefore, after the treatment of the silicon semiconductor wafer 20 with the low-energy particles, an approximately 0.5 µm to 5 µm thick µ-crystalline or amorphous layer or a layer composed of µ-crystalline and amorphous silicon is produced. In principle, it is also conceivable, however, to produce this µ-crystalline and/or amorphous layer, which can also contain hydrogen atoms, by deposition of the semiconductor material from a gas phase or other suitable deposition methods, without irradiating the surface with high-energy particles beforehand for this purpose. The µ-crystalline and/or amorphous layer 21 produced is illustrated in FIG. 3b.

Figure 3C:
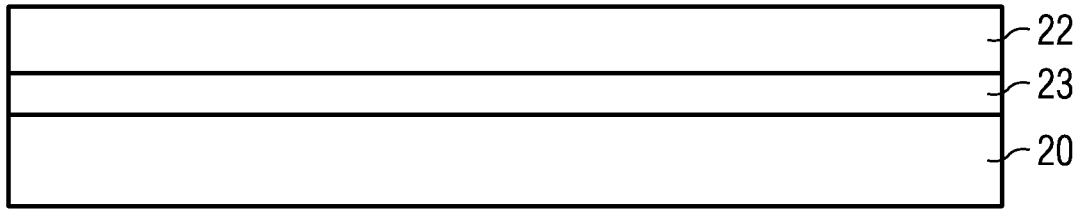

FIG. 3c illustrates the result after a further method step, wherein the µ-crystalline and/or amorphous layer 21 is subjected to a thermal treatment with a temperature above 800° Celsius, in particular with a temperature in the range of 1100° Celsius to 1200° Celsius. During this thermal treatment over a sufficiently long time duration, for example in the range of from 30 minutes to four hours, in particular two hours, the µ-crystalline and/or amorphous layer 21 recrystallizes and forms a second monocrystalline semiconductor region 22 composed of the same semiconductor material as the first monocrystalline semiconductor region 20. In the example of a silicon semiconductor material used with a (100) crystal orientation of the first monocrystalline region 20, the second semiconductor region 22 is recrystallized with a different crystal orientation, for example with a (111) or (311) crystal orientation. As a result, a third, strained semiconductor region 23 arises between the first monocrystalline semiconductor region 20 and the second monocrystalline semiconductor region 22. The magnitude of the strain in the third semiconductor region 23 can be influenced, for example, by the duration and the temperature of the thermal treatment of the µ-crystalline and/or amorphous layer 21. In the case of a thermal treatment of the µ-crystalline and/or amorphous layer 21 for two hours at 1200° C., it is possible to achieve a strain that is maximal from the present point of view. Weaker strains can be set given a shorter duration and/or lower temperatures of the thermal treatment.

An alternative embodiment of a method for producing a strained region in a semiconductor body is illustrated in FIG. 4.

Figure 4A:
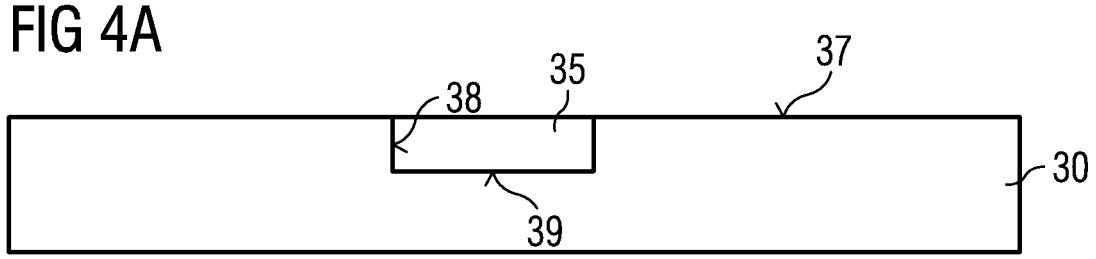
FIG. 4 shows an exemplary method sequence for producing a strained region in a semiconductor body.

FIG. 4a shows, a first monocrystalline semiconductor region 30 composed of a semiconductor material, for example silicon, having a first lattice constant along the reference direction X. The first monocrystalline semiconductor region 30 can be, for example, a semiconductor wafer or alternatively only part of a semiconductor wafer, such as an epitaxial layer, for example.

In this first monocrystalline semiconductor region 30, a trench 35 has been formed at a main surface 37 by means of an etching method, for example, the trench 35 extending from the main surface 37 perpendicularly into the first monocrystalline semiconductor region 30 and having sidewalls 38 and a base 39.

Figure 4B:
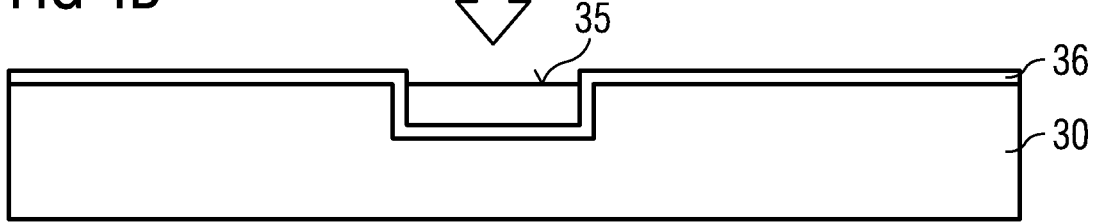

FIG. 4b illustrates the situation after a protective layer 36 such as, for example, an oxide layer, in particular an SiO$_2$ layer in the case of a silicon semiconductor material, is formed at the main surface 37 and also on the sidewalls 38 and at the base 39 of the trench 35.

Figure 4C:
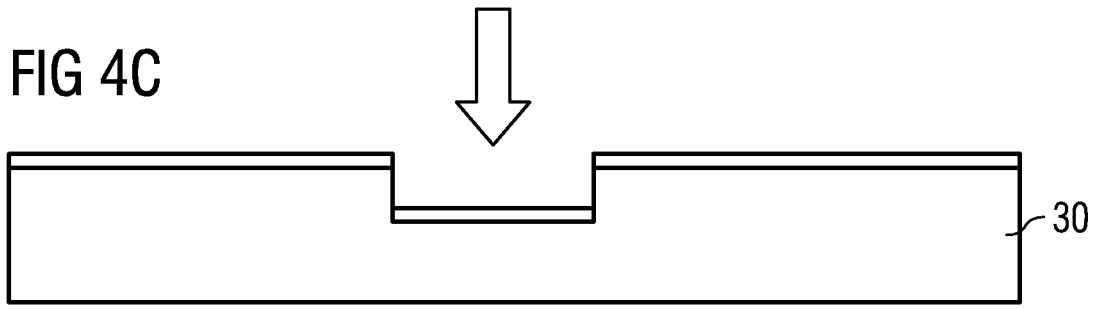
Figure 4D:
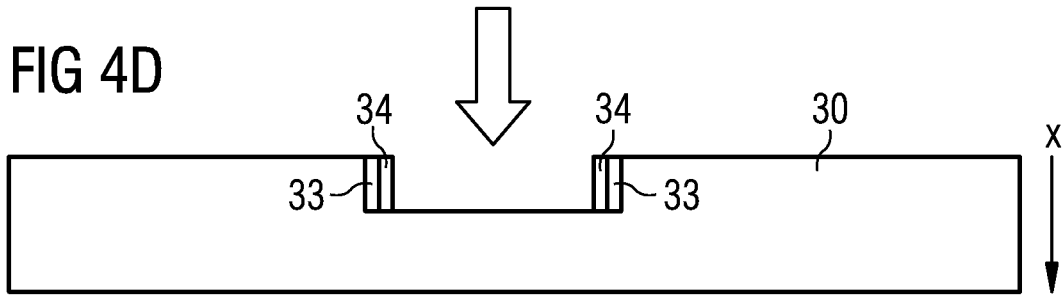

FIG. 4c shows the result of a further method step, after the protective layer 36 is removed from the sidewalls 38 of the trench 35, such that the first monocrystalline semiconductor region 30 is uncovered at the sidewalls 38 of the trench 35.

A second monocrystalline semiconductor region 34 composed of the same semiconductor material as the first monocrystalline semiconductor region 30 is subsequently produced at the sidewalls 38. This second monocrystalline semiconductor region 34 has a second lattice constant, which is different than the first lattice constant, along the reference direction X, such that a third, strained semiconductor region 33 arises along the sidewalls 38 between the first monocrystalline semiconductor region 30 and the second monocrystalline semiconductor region 34. The second monocrystalline semiconductor region 34 is produced for example using means similar to those already described with regard to FIG. 3. In this case, in the present exemplary embodiment, the uncovered first monocrystalline semiconductor region 30 is treated with the low-energy particles, such as hydrogen ions, for example, at the sidewalls 38 of the trench 35. As a result, atoms are released from the assemblage of the first monocrystalline semiconductor region 30, which atoms are then attached again to the first monocrystalline semiconductor region 30 as the second monocrystalline semiconductor region 34 having a different lattice constant, in particular having a different crystal orientation, and lead to the strain.

Such a structure can be used for a trench MOSFET, for example, wherein a gate electrode is formed in the trench 35, the gate electrode being separated from the semiconductor regions 30, 33 and 34 by a gate dielectric. In the case of this trench MOSFET, the channel region is situated along the sidewalls 38 of the trench 35, wherein the channel region at least partly comprises the strained semiconductor region 33.

In a further method (not illustrated), the second semiconductor layer, which preferably comprises silicon, can be applied on the first layer, which preferably likewise comprises silicon, by means of wafer bonding and can subsequently be thinned to the desired final thickness. Known methods such as e.g. the smart cut method or else alternatively grinding steps and/or etching steps are appropriate for the thinning. However, this variant entails the disadvantage of an unavoidable "rotational wafer misorientation", which, although it can be minimized by optimum alignment of the wafers with respect to one another, cannot be completely avoided as in the methods described above.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of producing a semiconductor body having a strained region, comprising:
   providing a first monocrystalline semiconductor region composed of a semiconductor material having a first lattice constant along a reference direction; and
   producing a second monocrystalline semiconductor region composed of the same semiconductor material as the first monocrystalline semiconductor region and a third, strained semiconductor region between the first and second monocrystalline semiconductor regions, by providing a semiconductor layer at a surface of the first monocrystalline semiconductor region and recrystallizing the semiconductor layer to form the second and third monocrystalline semiconductor regions such that the second monocrystalline semiconductor region has a second lattice constant, which is different from the first lattice constant along the reference direction, that induces a strain in the third monocrystalline semiconductor region.

2. The method as claimed in claim 1, wherein producing the second semiconductor region comprises:
   producing a μ-crystalline or amorphous or a partly μ-crystalline and partly amorphous layer at the surface of the first semiconductor region; and
   applying a thermal treatment to the μ-crystalline and/or amorphous layer with a sufficient temperature so that the μ-crystalline and/or amorphous layer re-crystallizes.

3. The method as claimed in claim 2, wherein the μ-crystalline and/or amorphous layer is produced by a deposition process on the surface of the first semiconductor region.

4. The method as claimed in claim 3, wherein the deposition process comprises:
   treating the surface of the first semiconductor region with low-energy particles so that atoms of the semiconductor material are dislodged from the monocrystalline first semiconductor region; and
   depositing the dislodged atoms on a remaining surface of the first semiconductor region.

5. The method as claimed in claim 4, wherein the low-energy particles are hydrogen ions.

6. The method as claimed in claim 3, wherein the deposition process is performed by sputtering or vapor deposition.

7. The method as claimed in claim 2, wherein the μ-crystalline and/or amorphous layer has a thickness of between 0.5 μm to 5 μm.

8. The method as claimed in claim 1, wherein the recrystallization comprises a thermal treatment that is performed in a temperature range of between 1100° Celsius and 1200° Celsius.

9. The method as claimed in claim 1, wherein the recrystallization comprises a thermal treatment that is performed for a duration in the range of from 30 minutes to four hours.

10. A method of producing a semiconductor body having a strained region, comprising:
    providing a first monocrystalline semiconductor region composed of a semiconductor material having a first lattice constant along a reference direction; and
    wafer bonding a second monocrystalline semiconductor region composed of the same semiconductor material as the first monocrystalline semiconductor region to the first monocrystalline semiconductor region, the second monocrystalline semiconductor region having a second lattice constant that is different than the first lattice constant such that a third, strained semiconductor region arises between the first and second monocrystalline semiconductor regions.

* * * * *